(12) United States Patent
Trusov et al.

(10) Patent No.: US 10,110,258 B2
(45) Date of Patent: Oct. 23, 2018

(54) ACCELERATED ERASURE CODING FOR STORAGE SYSTEMS

(71) Applicant: EMC IP Holding Company LLC, Hopkinton, MA (US)

(72) Inventors: Maxim Trusov, Saint Petersburg (RU); Mikhail Danilov, Saint Petersburg (RU); Konstantin Buinov, Kirovsk (RU); Kirill Zakharov, Saint Petersburg (RU); Andrey Kurilov, Saint Petersburg (RU)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/281,172

(22) Filed: Sep. 30, 2016

(65) Prior Publication Data

US 2017/0288704 A1    Oct. 5, 2017

(30) Foreign Application Priority Data

Mar. 30, 2016 (RU) ................................ 2016111896

(51) Int. Cl.
*H03M 13/37* (2006.01)
*G06F 11/10* (2006.01)
*H03M 13/15* (2006.01)

(52) U.S. Cl.
CPC ........... *H03M 13/373* (2013.01); *G06F 11/10* (2013.01); *H03M 13/1515* (2013.01)

(58) Field of Classification Search
CPC ............. G06F 11/1076; G06F 11/1435; G06F 11/1088; G06F 11/10; H03M 13/611; H03M 13/616; H03M 13/2909; H03M 13/373; H03M 13/1515
See application file for complete search history.

(56) References Cited

U.S. PATENT DOCUMENTS

| | | | |
|---|---|---|---|
| 6,070,003 A | 5/2000 | Gove et al. | |
| 6,550,035 B1 | 4/2003 | Okita | |
| 7,549,110 B2 | 6/2009 | Stek et al. | |
| 7,559,007 B1 | 7/2009 | Wilkie | |
| 7,581,156 B2 | 8/2009 | Manasse | |
| 8,458,515 B1 | 6/2013 | Saeed | |
| 8,532,212 B2 | 9/2013 | Ito | |
| 8,683,296 B2 | 3/2014 | Anderson et al. | |
| 8,683,300 B2 | 3/2014 | Stek et al. | |
| 8,762,642 B2 | 6/2014 | Bates et al. | |
| 8,914,706 B2 | 12/2014 | Anderson | |
| 9,753,807 B1 * | 9/2017 | Donlan | G06F 11/1435 |

(Continued)

OTHER PUBLICATIONS

U.S. Appl. No. 15/620,892, filed Jun. 13, 2017, Danilov et al.
(Continued)

*Primary Examiner* — Shelly A Chase
(74) *Attorney, Agent, or Firm* — Daly, Crowley Mofford & Durkee, LLP

(57) ABSTRACT

A method for generating coded fragments comprises receiving data to be encoded, splitting the data into a plurality of data fragments, identifying a first group of data fragments from among the plurality of data fragments using a coding matrix, summing the data fragments within the first group of data fragments to generate a first group sum, and using the first group sum to calculate at least a portion of two or more coded fragments.

17 Claims, 6 Drawing Sheets

(56) References Cited

U.S. PATENT DOCUMENTS

| | | | |
|---|---|---|---|
| 2005/0038968 | A1 | 2/2005 | Iwamura et al. |
| 2006/0105724 | A1 | 5/2006 | Nakao |
| 2006/0147219 | A1 | 7/2006 | Yoshino et al. |
| 2006/0155946 | A1 | 7/2006 | Ji |
| 2008/0126357 | A1 | 5/2008 | Casanova et al. |
| 2009/0112953 | A1 | 4/2009 | Barsness et al. |
| 2010/0037056 | A1 | 2/2010 | Follis et al. |
| 2010/0091842 | A1 | 4/2010 | Ikeda et al. |
| 2010/0180176 | A1 | 7/2010 | Yosoku et al. |
| 2010/0246663 | A1 | 9/2010 | Citta et al. |
| 2011/0029840 | A1 | 2/2011 | Ozzie et al. |
| 2011/0053639 | A1 | 3/2011 | Etienne Suanez et al. |
| 2011/0055494 | A1 | 3/2011 | Roberts et al. |
| 2011/0184997 | A1 | 7/2011 | Grube et al. |
| 2011/0196900 | A1 | 8/2011 | Drobychev et al. |
| 2012/0047339 | A1 | 2/2012 | Decasper et al. |
| 2012/0051208 | A1 | 3/2012 | Li et al. |
| 2012/0060072 | A1 | 3/2012 | Simitci et al. |
| 2012/0106595 | A1 | 5/2012 | Bhattad et al. |
| 2013/0067187 | A1 | 3/2013 | Moss et al. |
| 2013/0159603 | A1 | 6/2013 | Whitney |
| 2014/0046997 | A1 | 2/2014 | Dain et al. |
| 2014/0201541 | A1 | 7/2014 | Paul et al. |
| 2014/0380125 | A1* | 12/2014 | Calder ............... G06F 11/10 714/766 |
| 2016/0092109 | A1 | 3/2016 | Wu et al. |
| 2016/0239384 | A1 | 8/2016 | Slik et al. |
| 2016/0246677 | A1 | 8/2016 | Sangamkar et al. |
| 2017/0046127 | A1 | 2/2017 | Fletcher et al. |
| 2017/0242732 | A1* | 8/2017 | Vairavanathan ...... G06F 9/5038 |
| 2017/0277915 | A1* | 9/2017 | Slik .................. G06F 21/78 |

OTHER PUBLICATIONS

U.S. Appl. No. 15/620,897, filed Jun. 13, 2017, Danilov et al.
U.S. Appl. No. 15/620,898, filed Jun. 13, 2017, Danilov et al.
U.S. Appl. No. 15/620,900, filed Jun. 13, 2017, Danilov et al.
U.S. Appl. No. 14/929,788, filed Nov. 2, 2015, Kurilov et al.
U.S. Appl. No. 15/083,324, filed Mar. 29, 2016, Danilov et al.
U.S. Appl. No. 15/193,144, filed Jun. 27, 2016, Kurilov et al.
U.S. Appl. No. 15/193,141, filed Jun. 27, 2016, Danilov et al.
U.S. Appl. No. 15/186,576, filed Jun. 20, 2016, Malygin et al.
U.S. Appl. No. 15/193,145, filed Jun. 27, 2016, Fomin et al.
U.S. Appl. No. 15/193,407, filed Jun. 27, 2016, Danilov et al.
U.S. Appl. No. 15/193,142, filed Jun. 27, 2016, Danilov et al.
U.S. Appl. No. 15/193,409, filed Jun. 27, 2016, Trusov et al.
Blömer et al., "An XOR-Based Erasure-Resilient Coding Scheme;" Article from CiteSeer; Oct. 1999; 19 Pages.
U.S. Non-Final Office Action dated Oct. 5, 2017 for U.S. Appl. No. 15/193,407; 14 pages.
U.S. Non-Final Office Action dated Oct. 18, 2017 for U.S. Appl. No. 15/193,145; 21 pages.
U.S. Non-Final Office Action dated Sep. 15, 2017 for U.S. Appl. No. 15/193,409; 12 pages.
U.S. Appl. No. 15/398,832, filed Jan. 5, 2017, Danilov et al.
U.S. Appl. No. 15/398,826, filed Jan. 5, 2017, Danilov et al.
U.S. Appl. No. 15/398,819, filed Jan. 5, 2017, Danilov et al.
Anvin, "The Mathematics of RAID-6;" First Version Jan. 20, 2004; Last Updated Dec. 20, 2011; Retrieved from https://www.kernel.org/pub/linux/kernel/people/hpa/raid6.pdf; 9 Pages.
U.S. Non-Final Office Action dated Feb. 2, 2018 for U.S. Appl. No. 15/398,826; 16 Pages.
Response to U.S. Non-Final Office Action dated Nov. 27, 2017 for U.S. Appl. No. 15/186,576; Response filed Feb. 23, 2018; 7 pages.
U.S. Final Office Action dated Mar. 1, 2018 for U.S. Appl. No. 15/193,145; 32 pages.
U.S. Final Office Action dated Mar. 2, 2018 for U.S. Appl. No. 15/193,409; 10 pages.
Final Office Action dated Jun. 19, 2018 for U.S. Appl. No. 15/398,826; 8 pages.
Office Action dated Nov. 27, 2017 from U.S. Appl. No. 15/186,576; 11 Pages.
Response to Office Action dated Sep. 15, 2017 from U.S. Appl. No. 15/193,409, filed Dec. 14, 2017; 11 Pages.
Response to Office Action dated Oct. 5, 2017 from U.S. Appl. No. 15/193,407, filed Dec. 20, 2017; 12 Pages.
Response to Office Action dated Oct. 18, 2017 from U.S. Appl. No. 15/193,145, filed Jan. 17, 2018; 12 Pages.
U.S. Non-Final Office Action dated Jun. 18, 2018 for U.S. Appl. No. 15/398,819; 8 Pages.

* cited by examiner

ACCELERATED ERASURE CODING FOR STORAGE SYSTEMS

CROSS REFERENCE TO RELATED APPLICATIONS

This application claims priority to Russian Patent Application Number 2016111896, filed Mar. 30, 2016, and entitled "ACCELERATED ERASURE CODING FOR STORAGE SYSTEMS," which is incorporated herein by reference in its entirety.

BACKGROUND

Distributed storage systems may provide a wide range of storage services, while achieving high scalability, availability, and serviceability. An example of a distributed storage system is Elastic Cloud Storage (ECS) from EMC Corporation of Hopkinton, Mass.

Erasure coding is a coding technique originally created as a forward error correction method for binary erasure channels. More recently, erasure coding has been used to protect data within storage systems, including distributed storage systems.

Although erasure coding implementations may utilize relatively simple arithmetic operations, the number of operations required to encode or decode data may increase with the size of the data. Thus, existing erasure coding implementations may not scale well for large data sets, require an unacceptable amount of processing and/or time to encode/decode the data.

SUMMARY

Described herein are embodiments of techniques that can reduce the amount of processing and time required to perform erasure coding over data sets. In one embodiment, a technique can accelerate erasure coding by reducing the number or arithmetic operations that need to be performed. In some embodiments, techniques can be used for capacity and time efficient data protection within storage systems, including distributed storage systems such as ECS.

According to one aspect of the disclosure, a method comprises: receiving data to be encoded; splitting the data into a plurality of data fragments; identifying a first group of data fragments from among the plurality of data fragments using a coding matrix; summing the data fragments within the first group of data fragments to generate a first group sum; and using the first group sum to calculate at least a portion of two or more coded fragments.

In various embodiments, the coding matrix comprises a binary coding matrix. In certain embodiments, identifying the first group of data fragments from among the plurality of data fragments comprises counting a number of 1's within rows of the coding matrix. In one embodiment, summing the data fragments within the first group of data fragments comprising XOR'ing the data fragments within the first group of data fragments. In some embodiments, the method further comprises updating two or more rows of the coding matrix to set 1's to 0's, wherein each of the two or more updated rows of the coding matrix is associated with a corresponding one of the two or more coded fragments. In certain embodiments, the method further comprises: identifying a second group of data fragments from among the plurality of data fragments using the updated coding matrix; summing the data fragments within the second group of data fragments to generate a second group sum; and using the second group sum to calculate at least a portion of two or more coded fragments.

In some embodiments, identifying the first group of data fragments comprises using a greedy algorithm. In one embodiment, identifying a group of the data fragments using a greedy algorithm comprises: generating two or more groups of data fragments each having the same number of data fragments; for each of the two or more groups of data fragments, counting a number of coded fragments whose calculations include the sum of the data fragments within the group; and identifying the first group of data fragments as the group of data fragments from among the two or more groups of data fragments having the highest count.

In certain embodiments, the method further comprises storing the plurality of data fragments and the two or more coded fragments across multiple nodes of a distributed storage system.

According to another aspect of the disclosure, a system comprises one or more processors; a volatile memory; and a non-volatile memory storing computer program code that when executed on the processor causes execution across the one or more processors of a process operable to perform embodiments of the method described hereinabove.

According to yet another aspect of the disclosure, a computer program product tangibly embodied in a non-transitory computer-readable medium, the computer-readable medium storing program instructions that are executable to perform embodiments of the method described hereinabove.

BRIEF DESCRIPTION OF THE DRAWINGS

The concepts, structures, and techniques sought to be protected herein may be more fully understood from the following detailed description of the drawings, in which.

The drawings are not necessarily to scale, or inclusive of all elements of a system, emphasis instead generally being placed upon illustrating the concepts, structures, and techniques sought to be protected herein.

DETAILED DESCRIPTION

Before describing embodiments of the structures and techniques sought to be protected herein, some terms are explained. As used herein, the term "storage system" encompass, for example, private or public cloud computing systems for storing data as well as systems for storing data comprising virtual infrastructure and those not comprising virtual infrastructure. As used herein, the terms "client" and "user" may refer to any person, system, or other entity that uses a storage system to read/write data.

As used herein, the term "storage device" may refer to any non-volatile memory (NVM) device, including hard disk drives (HDDs), flash devices (e.g., NAND flash devices), and next generation NVM devices, any of which can be accessed locally and/or remotely (e.g., via a storage attached network (SAN)). The term "storage device" may also refer to a storage array comprising one or more storage devices.

Figure 1:
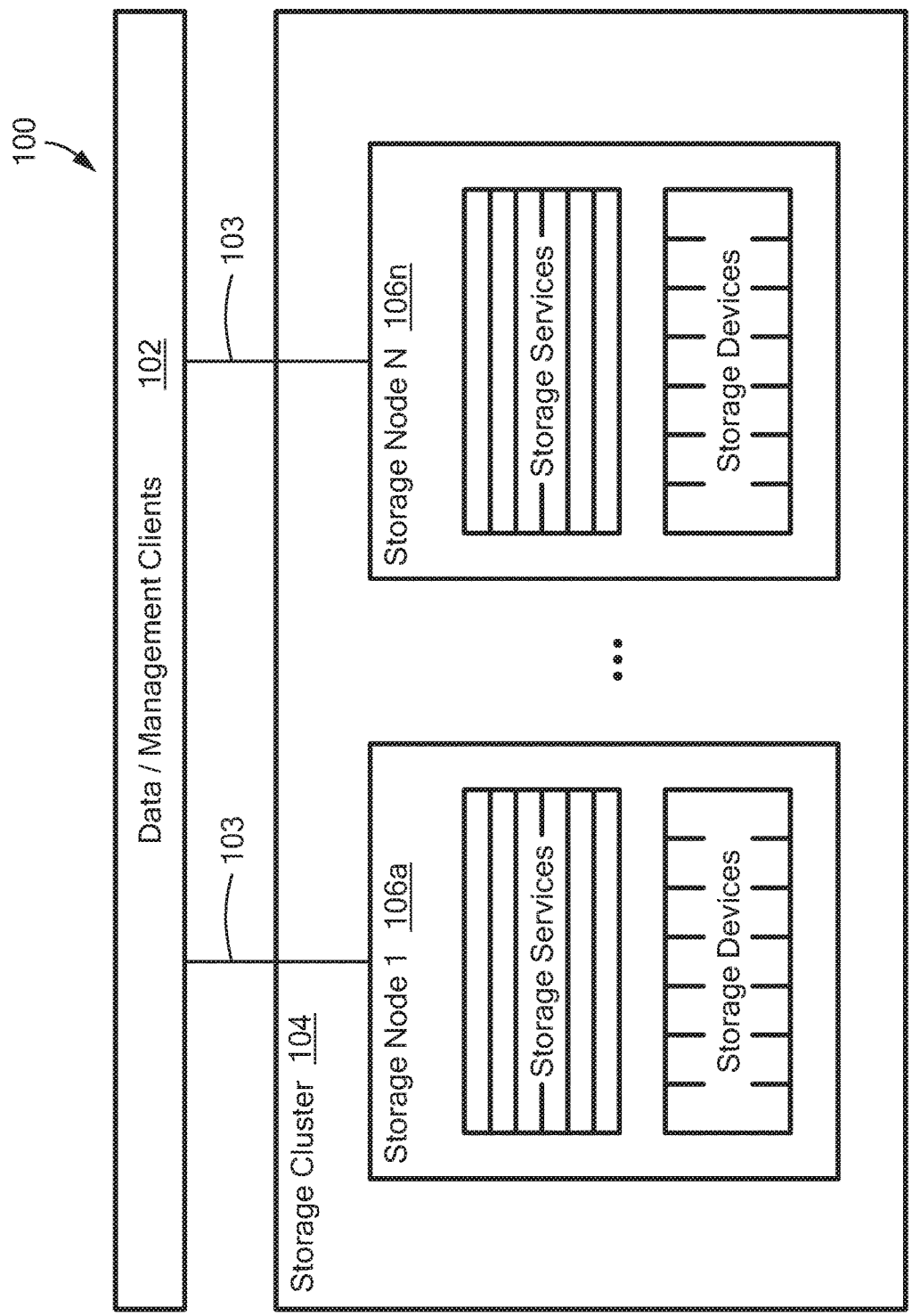
FIG. 1 is a block diagram of a distributed storage system, in accordance with an embodiment of the disclosure.
Figure 1A:
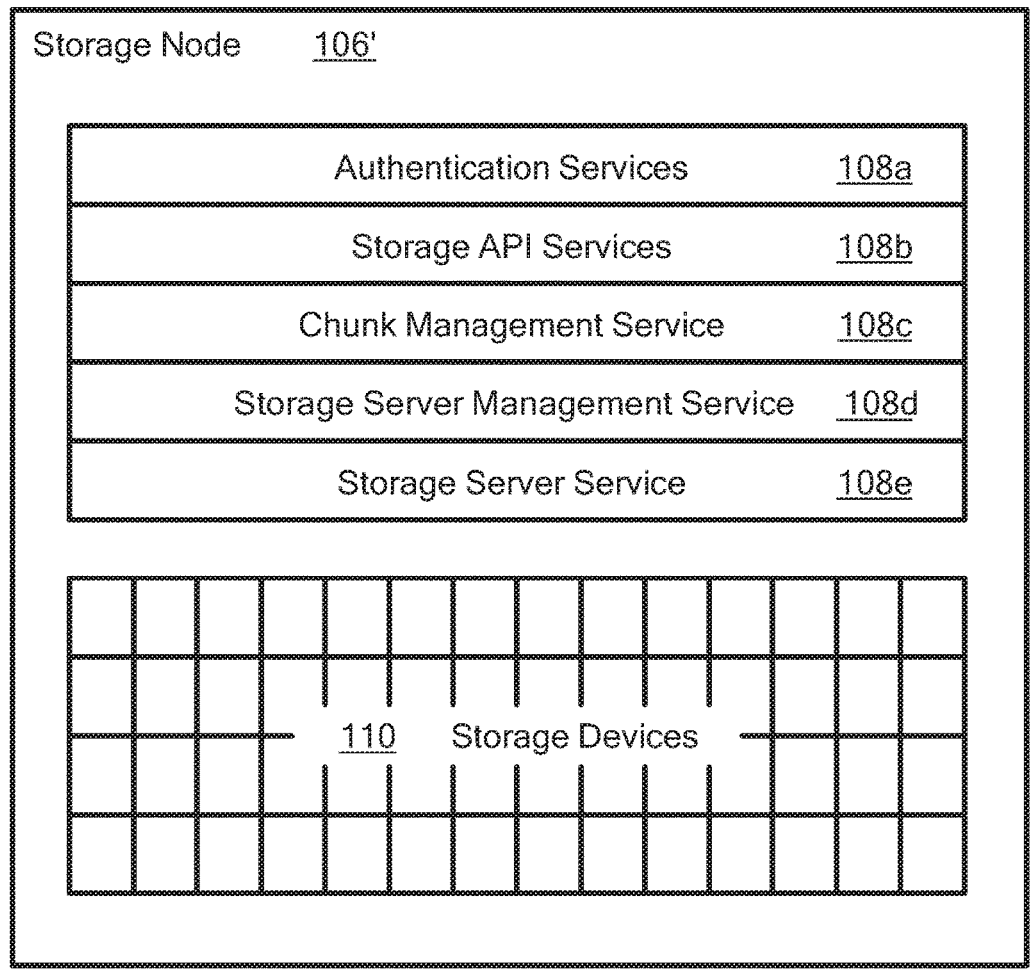
FIG. 1A is a block diagram of a storage node that may form a part of a distributed storage system, in accordance with an embodiment of the disclosure.

FIG. 1 shows a distributed storage system 100, in accordance with an embodiment of the disclosure. The distributed storage system 100 may include one or more clients 102 in communication with a storage cluster 104 via a network 103. The network 103 may include any suitable type of communication network or combination thereof, including networks using protocols such as Ethernet, Internet Small Computer System Interface (iSCSI), Fibre Channel (FC), and/or wireless protocols. The clients 102 may include user applications, application servers, data management tools, and/or testing systems. The storage cluster 104 includes one or more storage nodes 106a . . . 106n (generally denoted 106). An illustrative storage node is shown in FIG. 1A and described below in conjunction therewith. In some embodiments, the storage cluster 104 utilizes Elastic Cloud Storage (ECS) from EMC Corporation of Hopkinton, Mass.

In general operation, clients 102 issue requests to the storage cluster 104 to read and write data. A given request may be received by any available storage node 106. The receiving node 106 may process the request locally and/or may delegate request processing to one or more other nodes 106 (referred to herein as its "peer nodes"). In some embodiments, client data may be split into fixed size pieces (referred to herein as "chunks") for storage within the cluster 104. In some embodiments, padding can be added to a chunk to ensure that that all chunks are of equal size.

In particular embodiments, the system 100 can use erasure coding to protect against data loss. In certain embodiments, the system 100 may reduce the amount of processing and time required to perform erasure coding by utilizing techniques described below in conjunction with FIGS. 3 and 4.

FIG. 1A shows an illustrative storage node 106', in accordance with an embodiment of the disclosure. The storage node 106' may be the same as or similar to a storage node 106 in FIG. 1. A storage node 106' may include one or more services 108 and one or more storage devices 110, as shown. In one embodiment, the storage node 106' may include a processor and a non-volatile memory storing computer program code that when executed on the processor causes the processor to execute processes operable to perform functions of the services 108.

As shown, a storage node 106' may include the following services according to some embodiments: an authentication service 108a to authenticate requests from clients 102; storage API services 108b to parse and interpret requests from clients 102; a storage chunk management service 108c to facilitate storage chunk allocation/reclamation for different storage system needs and monitor storage chunk health and usage; a storage server management service 108d to manage available storage devices capacity and to track storage devices states; and a storage server service 108e to interface with the storage devices 110.

In various embodiments, the storage chunk management service 108c is configured to perform erasure coding, while utilizing techniques described below in conjunction with FIGS. 3 and 4.

Storage devices 110 may comprise one or more physical and/or logical storage devices attached to the storage node 106a. In certain embodiments, storage devices 110 may be provided as a storage array. In particular embodiments, storage devices 110 may be provided as VNX or Symmetrix VMAX, which are available from EMC Corporation of Hopkinton, Mass.

In particular embodiments, the storage node 106' can use erasure coding to protect against data loss. In certain embodiments, storage node 106' may reduce the amount of processing and time required to perform erasure coding by utilizing techniques described below in conjunction with FIGS. 3 and 4.

Figure 2:
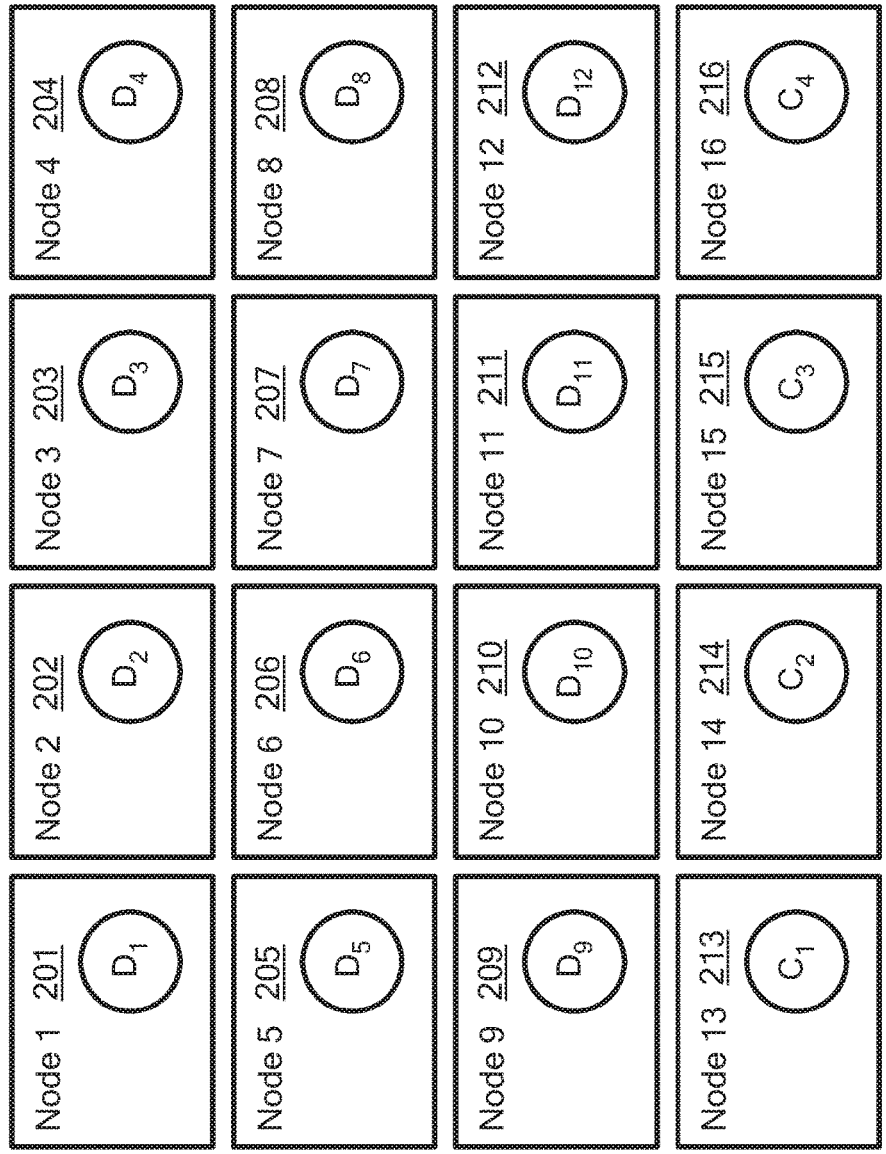
FIG. 2 is a diagram illustrating data protection within a distributed storage system, in accordance with an embodiment of the disclosure.

FIG. 2 illustrates how a distributed storage system 200 can use erasure coding to protect against data loss, according to embodiments of the disclosure. In various embodiments, a chunk of data to be stored (D) may be split the data into k data fragments $D_1, D_2 \ldots, D_k$ and, using coding techniques described herein below, m coded fragments $C_1, C_2, \ldots, C_m$ may be generated from the k fragments. In some embodiments, the coded fragments encode information that can be used to restore data fragments and, thus, may be considered "redundant." In some embodiments, the storage system 200 can use a coding scheme that allows it to tolerate the loss of any m data fragments. In the embodiment of FIG. 2, k=12 and m=4, although other values of k and m can be used.

As shown in FIG. 2, the data fragments $D_1, D_2, \ldots, D_k$ and coded fragments $C_1, C_2, \ldots, C_m$ may be stored across several nodes of the storage system 200. In the illustrative embodiment, the storage system 200 includes sixteen (16) nodes 201-216, with each node 201-216 storing exactly one data fragment or coded fragment. In other embodiments, a given node 201-216 may store multiple data fragments and/or multiple coded fragments (e.g., if k+m is greater than the number of available nodes). In yet other embodiments, some nodes may not store any data fragments or coded fragments (e.g., if k+m is less than the number of available nodes). In some embodiments, a node 201-216 may be the same or similar to the node 106' of FIG. 1A.

In certain embodiments, data D may be split into k equal size data fragments $D_1, D_2, \ldots, D_k$, with padding or other data complement being added as needed as needed to ensure the data fragments are of equal size. In one embodiment, data D may have a size of about 128 Mb and may be split into twelve (12) data fragments k.

In some embodiments, if a data fragment $D_1, D_2 \ldots, D_k$ is lost (e.g., due to a node failure, a storage device failure, or data corruption), the lost data fragment may be regenerated using available data fragments $D_1, D_2 \ldots, D_k$, and redundant information within available coded fragments $C_1, C_2, \ldots, C_m$. In certain embodiments, at least k unique available fragments—either data fragments or coded fragments—may be required to decode a lost data fragment. Thus, according to some embodiments, the system 200 can tolerate the loss of any m fragments.

According to some embodiments of the disclosure, a matrix-based Reed-Solomon erasure coding technique may be used for data protection within a storage system. In such embodiments, the to-be-encoded data D may be arranged as a column vector ("data vector") comprising k data fragments $D_1, D_2 \ldots, D_k$. An m×k matrix ("coding matrix") of coding coefficients $X_{1,j}$ can be provided. In some embodiments, coded fragments $C_1, C_2 \ldots, C_m$ may be generated by multiplying the m×k coding matrix by the k-element data vector. In certain embodiments, the coding coefficients $X_{i,j}$ which may be selected using known erasure coding techniques and/or based upon the specific erasure coding algorithm used. In some embodiments, the coding coefficients $X_{i,j}$ are selected such that the system can tolerate the loss of any m fragments.

In various embodiments, a storage system can perform erasure coding using a Galois Field. As used here, the notation GF(q) refers to a Galois Field having order q. In certain embodiments, the distributed storage system may perform erasure coding using $GF(2^W)$, where typical values for w include four (4), eight (8), sixteen (16), and thirty-two (32). In some embodiments, the operation of addition in any $GF(2^w)$ may be implemented using binary exclusive OR operator (XOR). In various embodiments, a storage system may perform erasure coding using GF(16), i.e., w=4.

In some embodiments, the encoding process described above may be performed as m independent dot products using individual rows from the coding matrix and the data vector. In particular embodiments, the $i^{th}$ coded fragment $C_i$ can be calculated as the dot product of the $i^{th}$ row of the coding matrix with the data vector. Thus, conventionally, the number of arithmetic operations required to encode and decode a chunk of data D may be proportional to size of the data D.

Figure 3:
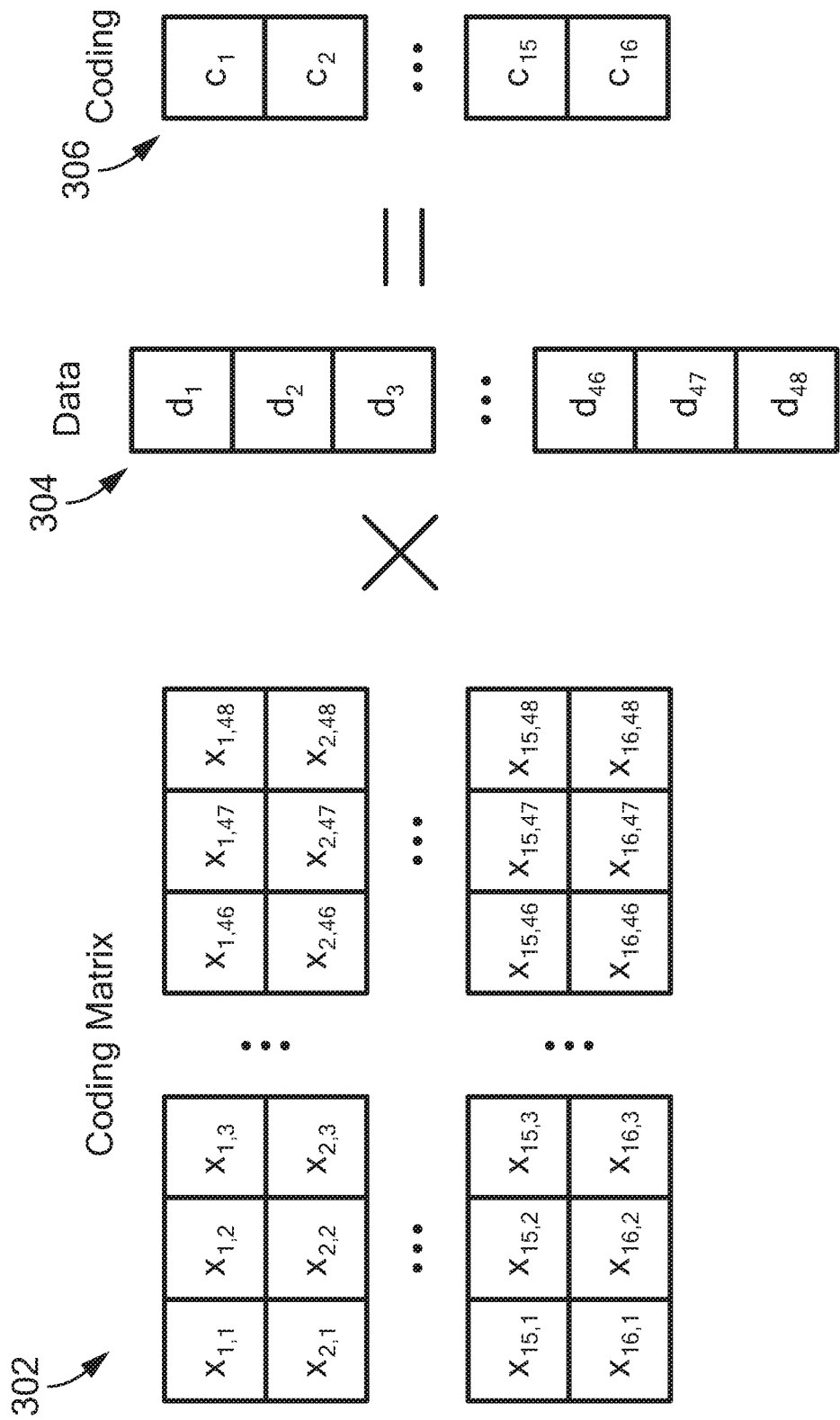
FIG. 3 is a diagram illustrating an erasure coding technique, in accordance with an embodiment of the disclosure.

Referring to FIG. 3, according to some embodiments, a storage system may use a technique to reduce the number of arithmetic operations required to encode and decode data D. The data D may be split into a plurality of so-called "small data fragments" $d_j$ and arranged in a column vector 304, as shown. The small data fragments $d_1$, may include elements from GF(2) and, thus, the column vector 304 may be referred to herein as a "binary data vector" 304. A coding matrix 302 may be multiplied by the column vector 304 to generate a plurality of so-called "small coded fragments" $c_j$ 306. The coding matrix 302 may include elements from GF(2) and, thus, may be referred to herein as a "binary coding matrix" 302.

In some embodiments, the data D may be split into a plurality data fragments $D_i$ having elements from $GF(2^W)$ and, thus, prior to erasure coding, the data fragments $D_i$ in $GF(2^W)$ may be converted to small data fragments $d_j$, in GF(2). In certain embodiments, to convert from $GF(2^W)$ to GF(2), each data fragment $D_i$ may be split into w small data fragments $d_j$. In some embodiments, a total of k×w small data fragments $d_j$ may be derived from data D and the binary data vector 304 may include (k×w) elements. In certain embodiments, elements ((i−1)·w)+1 ... (i·w) within the binary data vector 304 may correspond to the small data fragments generated from data fragment $D_i$. In some embodiments, each data fragment $D_i$ is the union of (i.e., a concatenation of) w "small" data fragments $d_{floor(i/w)+1}, \ldots, d_{floor(i/w)+w}$.

In certain embodiments, a coding matrix 302 may include elements from GF(2W) and, before erasure coding begins, the coding matrix 302 may be converted from $GF(2^W)$ to GF(2). In certain embodiments, to convert a coding matrix from $GF(2^W)$ to GF(2), each coefficient $X_{i,j}$ in $GF(2^W)$ can be binary into a w×w matrix comprised of coefficients $x_{i,j}$ in GF(2). The resulting binary coding matrix 302 may have dimensions (m×w)×(k×w). Any suitable technique may be used to expand/map a value in GF(2W) to a w×w matrix of values in GF(2). In other embodiments, a binary coding matrix 302 may be provided for use with erasure coding and, thus, conversion from $GF(2^W)$ to GF(2) may be unnecessary.

Referring again to FIG. 3, a (m×w)×(k×w) binary coding matrix 302 can be multiplied with a (k×w)-element binary data vector 304 to generate (m×w) small coded fragments $c_1$, $c_2, \ldots, c_{(m \times w)}$ 306. The small coded fragments, which will have elements in GF(2), can be combined to generate coded fragments $C_1$, having elements in $GF(2_W)$. In some embodiments, a coded fragment $C_i$ is a union of w small coded fragments $c_{floor(i/w)+1}, \ldots, c_{floor(i/w)+w}$.

As shown in FIG. 3, in one embodiment k=12, w=4, and m=4. The binary coding matrix 302 may be a 16×48 matrix, the binary data vector 304 may include forty-eight (48) small data fragments $d_1, d_2, \ldots, d_{48}$. Sixteen (16) small coded fragments $c_1, c_2, \ldots, c_{16}$ may be generated for the data D. In some embodiments, the small coded fragments may be combined to produce m=4 coded fragments $C_1$, $C_3, \ldots, C_4$ in $GF(2^4)$.

In various embodiments, erasure coding is performed using GF(2)—wherein where multiplication can be implemented using the binary AND operator and, thus, a given small coded fragment $c_i$ can be calculated as follows:

$$c_i = \Sigma_{j | x_{i,j} = 1} d_j$$

Also in embodiments where erasure coding is performed using GF(2), addition can be implemented using XOR and, thus, the above summation can be obtained incrementally, as follows:

(1) $c_i = c_i \oplus d_{j_1}$ (2) $c_i = c_i \oplus d_{j_2}$

...

(N) $c_i = c_i \oplus d_{j_N}$ where N is the number of ones in the corresponding row of the binary coding matrix 302.

In some embodiments, the number of XOR operations required to encode and decode data can be reduced by taking advantage of the fact that multiple different small coded fragments $c_i$ can be XOR'd by common set of small data fragments $d_j$. In certain embodiments, XOR'd by common set of small data fragments $d_j$ may result in improved efficiency, particularly when the size of a data fragment is large (e.g., 1 MB or larger).

According to embodiments of the disclosure, erasure coding may be accelerated by identifying groups of small data fragments that are common to multiple small coded fragments, calculating the sum of the group, and using the group sum to calculate the small coded fragments $c_i$. Consider the following (relatively simple) coding matrix in GF(2):

$$\begin{bmatrix} 0 & 1 & 0 & 1 \\ 0 & 1 & 1 & 1 \end{bmatrix}$$

In GF(2), small coded fragments $c_1$ and $c_2$ can be calculated as follows:

$c_1 = d_2 \oplus d_4$ $c_2 = d_2 \oplus d_3 \oplus d_4$

In some embodiments, the number of XOR operations required to calculate $c_1$ and $c_2$ can be reduced from three (3) to two (2) by identifying that the group $d_2$, $d_4$ appears in both equations, calculating the group sum once, and using the group sum within the calculation of both $d_1$ and $d_2$:

$s = d_2 \oplus d_4$ $c_1 = s$ $c_2 = s \oplus d_3$

In some embodiments, data fragment groups may be identified using a greedy algorithm (i.e., a step-wise process that heuristically makes locally optimal choices at each step with the goal of finding a global optimum).

According to some embodiments, the following greedy algorithm is used to identify groups of data fragments. In some embodiments, possible groups containing N small data fragments $d_j$ may be generated, where N is an arbitrary constant—for k×w small data fragments, there are $$\frac{(k \cdot w)!}{N!((k \cdot w) - N)!}$$

possible groups of N. In the some implementations, at each step, for each possible group, the algorithm may count the number of small coded fragments $c_j$ whose remaining calculation includes the sum of the small data fragments $d_j$ within the group. In many embodiments, a group with the highest number of small coded fragments $c_i$ may be selected. In certain embodiments, small data fragments $d_j$ within the selected group may be summed and the group sum can be added to each of the small coded fragments $c_i$ whose remaining calculation includes the group sum: $c_i = c_i \oplus s$.

In some embodiments, summation is performed using the XOR binary operator. In various embodiments, each small coded fragment $c_i$ may be initialized to zero ($c_i=0$) before the first step of the greedy algorithm.

In some embodiments, the binary coding matrix 302 can be used to identify all the small coded fragments $c_i$ whose remaining calculation involves the sum of the sum of small data fragments $d_j$ within a possible group. In certain embodiments, this involves finding the rows within the coding matrix 302 wherein the coefficients $x_{i,j}=1$ for every j where the small data fragment $d_j$ is in the group. In some embodiments, at each step, the binary coding matrix 302 may be updated to set each $x_{i,j}$ handled during the step to zero.

In certain embodiments, the greedy algorithm can be repeated until no row of the binary coding matrix 302 includes at least N ones. In some embodiments, after the greedy algorithm completes, any remaining small coded fragment calculations can be performed on a one-by-one basis (i.e., without using grouping).

The following (relatively simple) example illustrates the greedy algorithm used to identify common groups, according to some embodiments. Consider the following 4×4 binary coding matrix:

|       | $d_1$ | $d_2$ | $d_3$ | $d_4$ |
|-------|-------|-------|-------|-------|
| $c_1$ | 1     | 0     | 1     | 0     |
| $c_2$ | 0     | 1     | 1     | 0     |
| $c_3$ | 0     | 1     | 0     | 1     |
| $c_4$ | 1     | 0     | 1     | 1     |

Using N=2, there are $$\frac{4!}{2!(4-2)!} = 6$$

possible groupings of small data fragments $d_1 \ldots d_4$.

TABLE 1 illustrates a first step of the greedy algorithm, according to some embodiments.

TABLE 1

| Groups | Small coded fragments | | | | Counts |
|--------|-------|-------|-------|-------|--------|
|        | $c_1$ | $c_2$ | $c_3$ | $c_4$ |        |
| $d_1, d_2$ | 0 | 0 | 0 | 0 | 0 |
| $d_1, d_3$ | 1 | 0 | 0 | 1 | 2 |
| $d_1, d_4$ | 0 | 0 | 0 | 1 | 1 |
| $d_2, d_3$ | 0 | 1 | 0 | 0 | 1 |
| $d_2, d_4$ | 0 | 0 | 1 | 0 | 1 |
| $d_3, d_4$ | 0 | 0 | 0 | 1 | 1 |

The group $d_1$, $d_2$ is not needed in any small coded fragment calculation. The group $d_1$, $d_3$ is needed for two (2) small coded fragments: $c_1$ and $c_4$. All other groups are used in just one (1) small coded fragment calculation. Therefore, during the first step, the group $d_1$, $d_3$ may be selected. The data fragments in the selected group can be summed and group sum can be applied to with $c_1$ and $c_4$, as follows:

$$s = d_1 \oplus d_3$$

$$c_1 = c_1 \oplus s$$

$$c_4 = c_4 \oplus s$$

At the end of the step, the binary coding matrix can be updated to set $x_{1,1}$, $x_{1,3}$, $x_{4,1}$, and $x_{4,3}$ (the coefficients involved in the step) to zero:

|       | $d_1$ | $d_2$ | $d_3$ | $d_4$ |
|-------|-------|-------|-------|-------|
| $c_1$ | 0 | 0 | 0 | 0 |
| $c_2$ | 0 | 1 | 1 | 0 |
| $c_3$ | 0 | 1 | 0 | 1 |
| $c_4$ | 0 | 0 | 0 | 1 |

Figure 4:
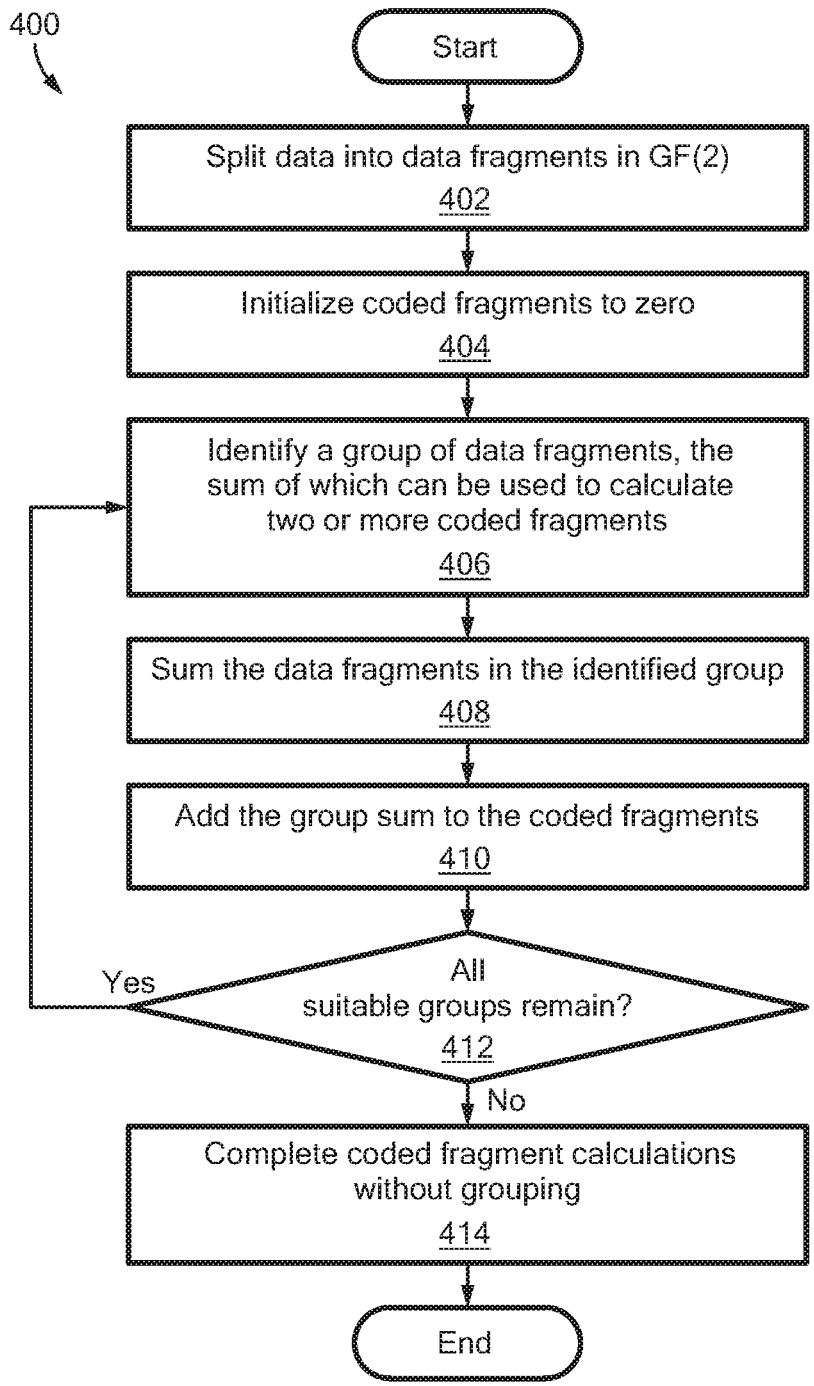
FIG. 4 is a flow diagram showing a method that may be used within the systems of FIGS. 1 and 1A, in accordance with an embodiment of the disclosure.

FIG. 4 is a flow diagram showing illustrative processing according to some embodiments of the disclosure. Rectangular elements (typified by element 402) herein denoted "processing blocks," represent computer software instructions or groups of instructions. Diamond shaped elements (typified by element 412), herein denoted "decision blocks," represent computer software instructions, or groups of instructions, which affect the execution of the computer software instructions represented by the processing blocks. Alternatively, the processing and decision blocks may represent steps performed by functionally equivalent circuits such as a digital signal processor circuit or an application specific integrated circuit (ASIC). The flow diagram does not depict the syntax of any particular programming language. Rather, the diagram illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. Unless otherwise indicated herein, the particular sequence of blocks described is illustrative only and can be varied without departing from the spirit of the concepts, structures, and techniques sought to be protected herein. Thus, unless otherwise stated the blocks described below are unordered meaning that, when possible, the functions represented by the blocks can be performed in any convenient or desirable order.

Referring to the example embodiment of FIG. 4, a method 400 can be used to generate m coded fragments $C_1$, $C_2$, ..., $C_m$ from data D using a reduced number of arithmetic operations, according to embodiments of the disclosure. In some embodiments, the method 400 (or portions thereof) can used by one or more services 108 within a storage node 106' (FIG. 1A).

At block 402, data to be encoded D may be split into a plurality of small data fragments $d_1$, $d_2$, ..., $d_{(k \times w)}$ having elements in GF(2). In some embodiments, the data D may have elements in $GF(2^W)$ and, thus, block 402 may include converting data elements from GF(2W) to GF(2).

Referring back to the example embodiment of FIG. 4, At block 404, small coded fragments $c_1$, $c_2$, ..., $c_{(m \times w)}$ may be initialized to zero. At block 406, a group of data fragments $d_j$ is identified, the sum of which can be used to calculate two or more of the small coded fragments $c_i$. In some embodiments, a greedy algorithm can be used to identify the group of data fragments. In one embodiment, the greedy algorithm described above in conjunction with FIG. 3 may be used.

In some embodiments, a bitwise coding matrix (e.g., matrix 302 in FIG. 2) can be used to identify the data fragment group (block 406). In such embodiments, the method 300 may include finding the rows within the coding matrix 302 wherein the coefficients $x_{i,j}=1$ for every j where the small data fragment $d_j$ is in the group.

Referring again to FIG. 4, at block 408, the data fragments within the identified group may be summed together. At block 410, the group sum may be added to each of the small coded fragments whose remaining calculations involve the group data fragments. In some embodiments, the bitwise coding matrix is updated to set each of the coefficients $x_{i,j}$ involved in current summations to zero.

In certain embodiments, the processing of blocks 406-412 in FIG. 4 may be repeated until no more suitable data fragment groups can be identified (block 412). In some embodiments, this involves determining if there are any groups having a predetermined number (N) of data fragments for which there are at least two small coded fragments whose remaining calculations involve those data fragments. At block 414 in FIG. 4, if no suitable data fragment group can be identified, the remaining small coded fragment calculations can be performed on a one-by-one basis (i.e., without using grouping).

In some embodiments, the m×w small coded fragments $c_1$, $c_2$, ..., $c_{(m \times w)}$ in GF(2) may be converted into m coded fragments $C_1$, $C_2$, ..., $C_m$ in $GF(2^W)$. In many embodiments, coded fragments may be stored across nodes of a distributed storage system to protect against loss.

Figure 5:
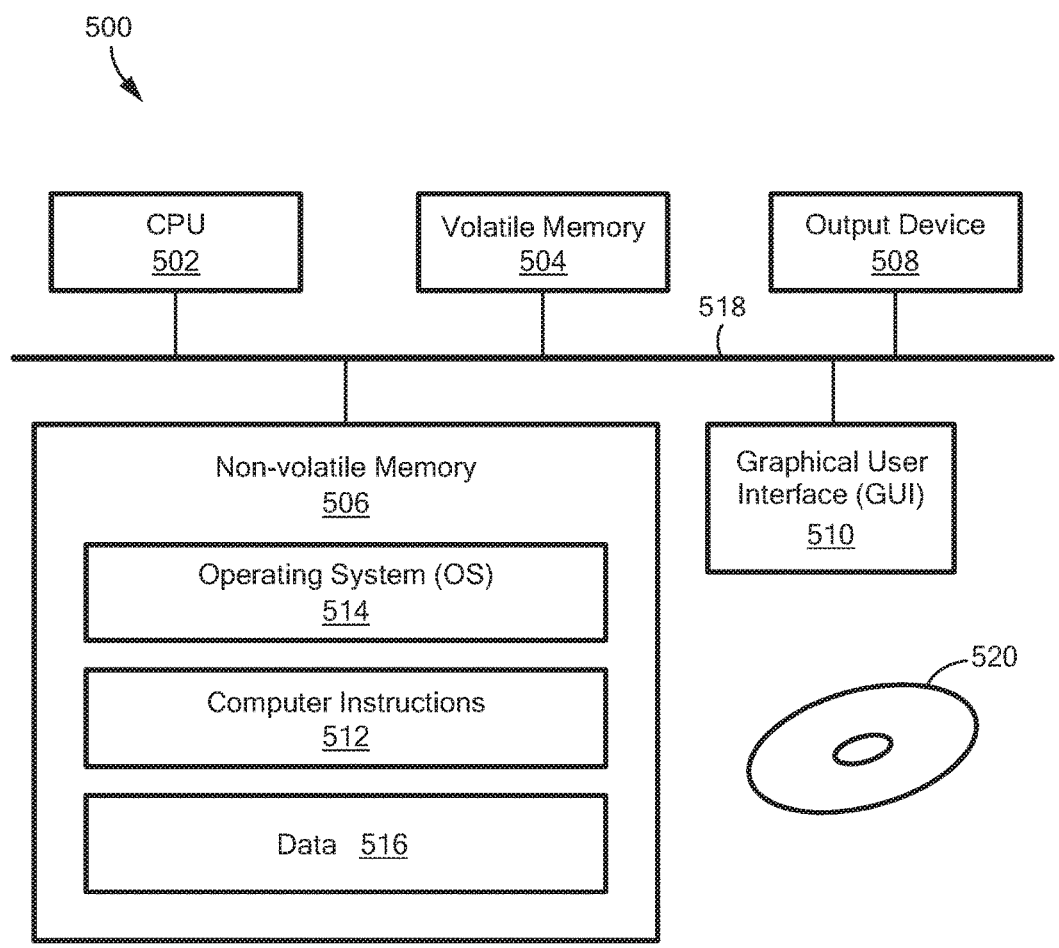
FIG. 5 is a schematic representation of a computer for use with the systems of FIGS. 1 and 1A, in accordance with an embodiment of the disclosure.

FIG. 5 shows an illustrative computer or other processing device 500 that can perform at least part of the processing described herein, in accordance with an embodiment of the disclosure. The computer 500 includes a processor 502, a volatile memory 504, a non-volatile memory 506 (e.g., hard disk), an output device 508 and a graphical user interface (GUI) 510 (e.g., a mouse, a keyboard, a display, for example), each of which is coupled together by a bus 518. The non-volatile memory 506 stores computer instructions 512, an operating system 514, and data 516. In one example, the computer instructions 512 are executed by the processor 502 out of volatile memory 504. In one embodiment, an article 520 comprises non-transitory computer-readable instructions.

Processing may be implemented in hardware, software, or a combination of the two. In various embodiments, processing is provided by computer programs executing on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that scope of protection sought herein should not be limited to the described embodiments but rather should be limited only by the spirit and scope of the following claims.

What is claimed is:

1. A method comprising:
    receiving data to be encoded;
    splitting the data into a plurality of data fragments;
    identifying a first group of data fragments from among the plurality of data fragments using a coding matrix;
    summing the data fragments within the first group of data fragments to generate a first group sum; and
    using the first group sum to calculate at least a portion of two or more coded fragments for erasure coding and storing the at least a portion of the two or more coded fragments in a data protection system configured to restore one or more lost ones of the data fragments.

2. The method of claim 1 wherein the coding matrix comprises a binary coding matrix, wherein identifying the first group of data fragments from among the plurality of data fragments comprises counting a number of 1's within rows of the coding matrix.

3. The method of claim 2 wherein summing the data fragments within the first group of data fragments comprising XOR'ing the data fragments within the first group of data fragments.

4. The method of claim 2 further comprising:
updating two or more rows of the coding matrix to set 1's to 0's, wherein each of the two or more updated rows of the coding matrix is associated with a corresponding one of the two or more coded fragments.

5. The method of claim 4 further comprising:
identifying a second group of data fragments from among the plurality of data fragments using the updated coding matrix;
summing the data fragments within the second group of data fragments to generate a second group sum; and
using the second group sum to calculate at least a portion of two or more coded fragments.

6. The method of claim 1 wherein identifying the first group of data fragments comprises using a greedy algorithm.

7. The method of claim 6 wherein identifying a group of the data fragments using a greedy algorithm comprises:
generating two or more groups of data fragments each having the same number of data fragments;
for each of the two or more groups of data fragments, counting a number of coded fragments whose calculations include the sum of the data fragments within the group; and
identifying the first group of data fragments as the group of data fragments from among the two or more groups of data fragments having the highest count.

8. The method of claim 1 further comprising:
storing the plurality of data fragments and the two or more coded fragments across multiple nodes of a distributed storage system.

9. A system comprising:
one or more processors;
a volatile memory; and
a non-volatile memory storing computer program code that when executed on the processor causes execution across the one or more processors of a process operable to perform the operations of:
receiving data to be encoded;
splitting the data into a plurality of data fragments;
identifying a first group of data fragments from among the plurality of data fragments using a coding matrix;
summing the data fragments within the first group of data fragments to generate a first group sum; and
using the first group sum to calculate at least a portion of two or more coded fragments for erasure coding and storing the at least a portion of the two or more coded fragments in a data protection system configured to restore one or more lost ones of the data fragments.

10. The system of claim 9 wherein the coding matrix comprises a binary coding matrix, wherein the computer program code causes execution of a process operable to identify the first group of data fragments from among the plurality of data fragments by counting a number of 1's within rows of the coding matrix.

11. The system of claim 10 wherein the computer program code causes execution of a process operable to sum the data fragments within the first group of data fragments by XOR'ing the data fragments within the first group of data fragments.

12. The system of claim 10 wherein the computer program code causes execution of a process further operable to:
update two or more rows of the coding matrix to set 1's to 0's, wherein each of the two or more updated rows of the coding matrix is associated with a corresponding one of the two or more coded fragments.

13. The system of claim 12 wherein the computer program code causes execution of a process further operable to:
identify a second group of data fragments from among the plurality of data fragments using the updated coding matrix;
sum the data fragments within the second group of data fragments to generate a second group sum; and
use the second group sum to calculate at least a portion of two or more coded fragments.

14. The system of claim 9 wherein the computer program code causes execution of a process operable to identify the first group of data fragments using a greedy algorithm.

15. The system of claim 14 wherein the computer program code causes execution of a process operable to identify a group of the data fragments using a greedy algorithm by:
generating two or more groups of data fragments each having the same number of data fragments;
for each of the two or more groups of data fragments, counting a number of coded fragments whose calculations include the sum of the data fragments within the group; and
identifying the first group of data fragments as the group of data fragments from among the two or more groups of data fragments having the highest count.

16. The system of claim 9 wherein the computer program code causes execution of a process further operable to:
store the plurality of data fragments and the two or more coded fragments across multiple nodes of a distributed storage system.

17. A computer program product tangibly embodied in a non-transitory computer-readable medium, the computer-readable medium storing program instructions that are executable to:
receive data to be encoded;
split the data into a plurality of data fragments;
identify a first group of data fragments from among the plurality of data fragments using a coding matrix;
sum the data fragments within the first group of data fragments to generate a first group sum; and
use the first group sum to calculate at least a portion of two or more coded fragments for erasure coding and storing the at least a portion of the two or more coded fragments in a data protection system configured to restore one or more lost ones of the data fragments.

* * * * *